United States Patent
Imura

(10) Patent No.: US 10,727,760 B2
(45) Date of Patent: Jul. 28, 2020

(54) POWER CONVERSION DEVICE FOR RECORDING REVERSE VOLTAGE STATE

(71) Applicant: DENSO CORPORATION, Kariya, Aichi-pref. (JP)

(72) Inventor: Takashi Imura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/430,924

(22) Filed: Jun. 4, 2019

(65) Prior Publication Data

US 2019/0379299 A1    Dec. 12, 2019

(30) Foreign Application Priority Data

Jun. 11, 2018 (JP) .................................. 2018-111080
May 29, 2019 (JP) .................................. 2019-100271

(51) Int. Cl.

| H02M 1/32 | (2007.01) |
|---|---|
| H02M 7/5387 | (2007.01) |
| G01R 19/165 | (2006.01) |
| H02H 7/12 | (2006.01) |
| G11C 16/30 | (2006.01) |
| H02H 7/122 | (2006.01) |
| H02M 1/00 | (2006.01) |
| H02J 7/00 | (2006.01) |
| H02H 11/00 | (2006.01) |

(52) U.S. Cl.
CPC .... H02M 7/5387 (2013.01); G01R 19/16571 (2013.01); G11C 16/30 (2013.01); H02H 7/1213 (2013.01); H02H 7/1222 (2013.01); *H02H 11/002* (2013.01); *H02J 7/0034* (2013.01); *H02M 2001/0009* (2013.01); *H02M 2001/0067* (2013.01)

(58) Field of Classification Search
CPC ....... H02M 7/5387; H02M 2001/0009; H02M 2001/0067; G01R 19/16571; G11C 16/30; H02H 7/1213; H02H 7/1222; H02H 11/002; H02H 11/003; H02J 7/0034
See application file for complete search history.

(56) References Cited

U.S. PATENT DOCUMENTS

| 6,127,788 A | 10/2000 | Yamamoto et al. | |
|---|---|---|---|
| 6,333,607 B1 | 12/2001 | Yamamoto et al. | |
| 2002/0047636 A1 | 4/2002 | Yamamoto et al. | |
| 2013/0327751 A1* | 12/2013 | Salsich | B23K 9/1043 219/137.71 |
| 2013/0327754 A1* | 12/2013 | Salsich | B23K 9/124 219/137.71 |

FOREIGN PATENT DOCUMENTS

JP    2007-053876 A    3/2007

* cited by examiner

*Primary Examiner* — Kyle J Moody
*Assistant Examiner* — Jye-June Lee
(74) *Attorney, Agent, or Firm* — Posz Law Group, PLC

(57) ABSTRACT

A power conversion circuit is provided. The power conversion circuit includes a bridge circuit connected between power input terminals, a drive circuit supplied with power from a DC power source via the power input terminals, a boost circuit for, when the DC power source is reversely connected, starting up and supplying power to a control circuit, and a reverse voltage detection circuit for detecting a reverse voltage generated when the DC power source is reversely connected.

8 Claims, 9 Drawing Sheets

POWER CONVERSION DEVICE FOR RECORDING REVERSE VOLTAGE STATE

CROSS REFERENCE TO RELATED APPLICATIONS

This application is based on Japanese Patent Application No. 2018-11080 filed on Jun. 11, 2018 and Japanese Patent Application No. 2019-100271 filed on May 29, 2019, disclosures of which are incorporated herein by reference.

TECHNICAL FIELD

The present disclosure relates to a power conversion device.

BACKGROUND

When a battery serving as a DC power source is reversely connected to a power conversion device such as a motor inverter device provided in a vehicle for example, a high current may flow in a parasitic diode of a MOSFET constituting the inverter. In this case, because of a heat dissipation structure of the MOSFET, it may resist heat in a short period of time but may be destroyed when time passes.

In view of this, there is a conventional product employing a structure in which, at a power-input-terminal portion, a series circuit of a Zener diode and a fuse is connected in parallel to an overvoltage protection diode so that the fuse can be fused. This makes it possible to determine the occurrence of reverse battery connection based on a fused state of the fuse.

Discussion on the above background art will be given. The below discussion may not necessarily constitute the prior art.

In the conventional product, the Zener diode itself needs to have a large rating in order that, until fusing of the fuse substituted by a bonding wire, the Zener diode is prevented from breaking down. Accordingly, an area occupied by the Zener diode becomes large when the Zener diode is formed on an IC, causing an increase in chip area in total.

In addition, although it is determinable whether a reverse voltage was applied based on presence or absence of fusing of the fuse, further information is unobtainable. For example, information such as a period of time until the fusing, voltage and temperature during the reversely connected state is unobtainable, and accordingly, it is unclear what happened until the fusing of the fuse, and a disadvantage is that useful information for failure diagnosis cannot be provided.

SUMMARY

It is an object of the present disclosure to provide a power conversion device that, with a simple configuration, is capable of recording information on reverse connection of a DC power source.

An example of a power conversion device in the present disclosure comprises: a bridge circuit that is connected between first and second power-input-terminals; a driving circuit that is supplied with power from a DC power source via the first and second power-input-terminals, and that drives and controls the bridge circuit; a control circuit that is capable of writing data into a non-volatile storage device; a boost circuit that starts up and performs a boost operation to supply power to the control circuit when the DC power source is connected in reverse polarity to the first and second power-input-terminals; and a reverse voltage detection circuit that detects a reverse voltage generated when the DC power source is connected in the reverse polarity to the first and second power-input-terminals, wherein when the boost circuit starts up, the control circuit is supplied with the power and records in the non-volatile storage device a state of the reverse voltage detected by the reverse voltage detection circuit.

When employing the above-mentioned configuration, it is possible to cause the boost circuit to boost a small voltage applied to the bridge circuit to generate power for the control circuit when the DC power source is connected to the first and the second power-input-terminals such that its positive and negative polarities are reversed, that is, the DC power source is reversely connected. The control circuit, when supplied with the power from the boost circuit, can record in the non-volatile storage device the reverse voltage state detected by the reverse voltage detection circuit until an occurrence of a failure due to a high reverse current flowing in the bridge circuit. Consequently, it becomes possible to obtain information on the reverse voltage generated by the reverse connection of the DC power source, and thus, it becomes possible to recognize under what circumstance the failure due to the reverse connection occurred and it becomes possible to precisely analyze the failure.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

First Embodiment

In the below, a first embodiment will be described with reference to FIG. 1 to FIG. 8.

Figure 1:
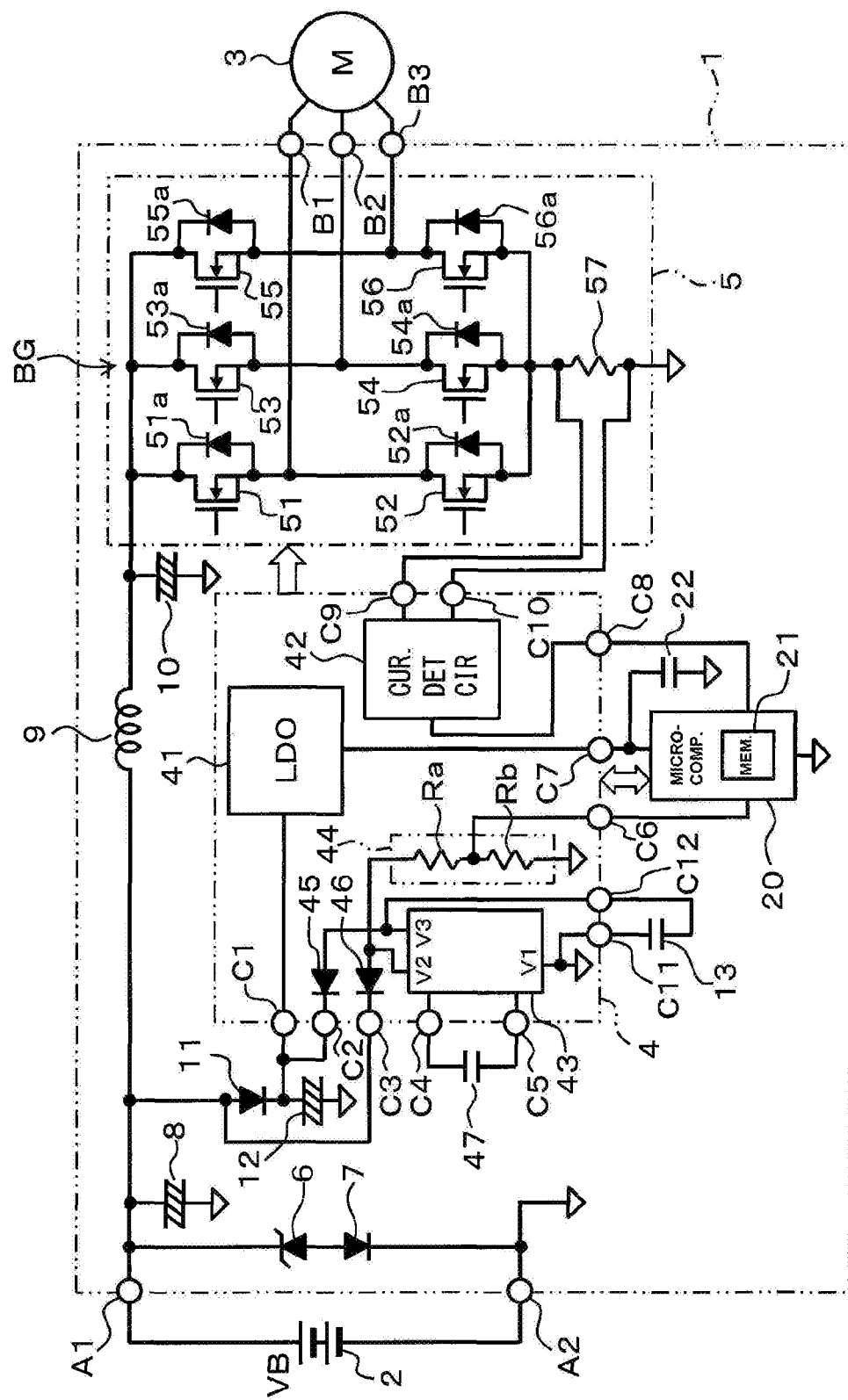
FIG. 1 is a diagram illustrating an electrical configuration of a power conversion device according to a first embodiment.

In FIG. 1, a power conversion device 1 generates three-phase power to drive a motor 3 based on power supplied from a battery 2 serving as a DC power source. The battery 2 is connected between a first power-input-terminal A1 and a second power-input-terminal A2 of the power conversion device 1 and supplies a DC voltage VB. The first power-input-terminal A1 is connected to a positive electrode of the battery 2 and the second power-input-terminal A2 is connected to a negative electrode of the battery 2. Three input terminals of the motor 3 are connected to output terminals B1, B2, B3 of the power conversion device 1.

The power conversion device 1 is configured mainly with an IC 4 serving as a driving circuit and a three-phase inverter circuit 5 serving as a bridge circuit. In the power conversion device 1, a series circuit of a Zener diode 6 and a diode 7 is connected between the power-input-terminal A1 and the power-input-terminal A2.

The first power-input-terminal A1 is connected to ground via a capacitor 8, and is connected to a power terminal of the three-phase inverter circuit 5 via a coil 9. The power terminal of the three-phase inverter circuit 5 is connected to the ground via a capacitor 10. The first power-input-terminal A1 is connected to the ground via a diode 11 and a capacitor 12 which are connected in serial, and a cathode of the diode 12 is connected to an input terminal C1 of the IC 4.

The IC 4 is formed as an ASIC (application specific integrated circuit), and has a monolithic structure using an SOI (silicon on insulator) substrate as described below. A power supply circuit 41, a current detection circuit 42, an inverting boost circuit 43, a reverse voltage detection circuit 44, and the like are integrally formed inside the IC 4. The IC 4 generates and outputs a control signal for driving the three-phase inverter circuit 5.

The power supply circuit 41 employs a low-dropout voltage regulator (LOD), and supplies a predetermined voltage to a microcomputer 20 serving as a control circuit via a terminal C7. The current detection circuit 42 detects a current flowing in the three-phase inverter circuit 5 and outputs a detected current value to the microcomputer 20 via a terminal C8. A capacitor 47 is connected to the inverting boost circuit 43 via terminals C4, C5, and a capacitor 13 is connected to the inverting boost circuit 43 via terminals C11, C12. When a reverse voltage is applied between the first and second power-input-terminals A1, A2, the reverse voltage generated in the three-phase inverter circuit 5 is applied to power terminals V1, V2, and based on this voltage, the inverting boost circuit 43 performs a boost operation. The inverting boost circuit 43 supplies the boosted voltage from a diode 45 to the power supply circuit 41 via a terminal C2 and a terminal C1. In the drawings, the current direction circuit 42 is depicted as CUR. DET. CIR.

The reverse voltage detection circuit 44 is a series circuit of two dividing resistors Ra, Rb, and its one end is connected to the terminal C2 via a diode 46 in a forward direction, and the other end is connected to the ground. The terminal C2 is connected to the power-input-terminal A1. The reverse voltage detection circuit 44 is put in a conductive state when the reverse voltage is applied between the first and the second power-input-terminals A1, A2, and a detection voltage generated across the dividing resistor Rb is output to the microcomputer 20 via a terminal C6.

A predetermined voltage is supplied to the microcomputer 20 from the power supply circuit 41 via the terminal C7 of the IC 4. A capacitor 22 is connected between the ground and the power supply path to the microcomputer 20. The microcomputer 20 transmits and receives a signal to and from the IC 4, and outputs a control signal to the IC 4 based on a detection signal from the three-phase inverter circuit 5. A non-volatile memory 21 serving as non-volatile storage device is provided in the microcomputer 20 in addition to a typical memory.

The three-phase inverter circuit 5 includes a bridge circuit BG in which six MOSFETs 51 to 56 are bridge-connected to correspond to three phases. Each MOSFETs 51 to 56 has a structure in which a diode 51a to 56a serving as a parasitic diode is connected. Arm output terminals of the respective three-phases are connected to the motor 3 via the respective terminals B1 to B3. The bridge circuit BG and a current detection resistor 57, which are connected in series, are connected between the first and second power-input-terminals A1, A2. The three-phase inverter circuit 5 includes therein a driving unit that applies gate driving signals to the MOSFETs 51 to 56.

Figure 2:
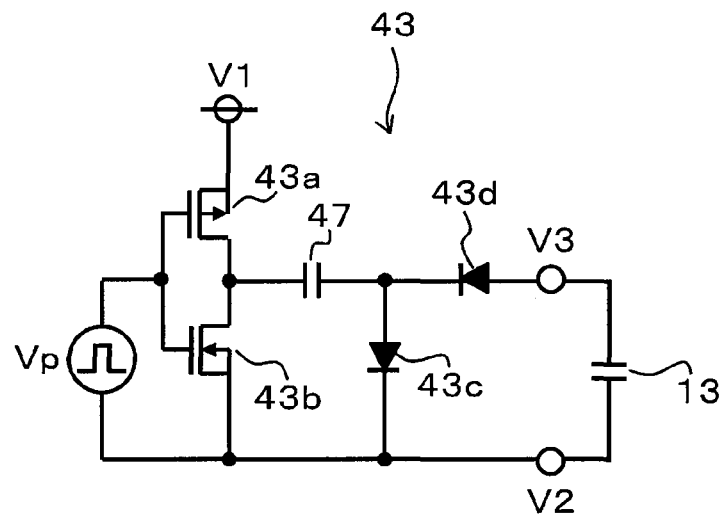
FIG. 2 is a diagram of an electrical configuration of an inverting boost circuit.

FIG. 2 illustrates an example of an electrical configuration of the inverting boost circuit 43. A series circuit of a p-channel type MOSFET 43a and an n-channel type MOSFET 43b in the inverting boost circuit 43 is connected between the power terminals V1 and V2. Gates of the MOSFETs 43a and 43b are commonly connected and a pulse signal alternately and repeatedly changing between high and low is applied to the gates of the MOSFETs 43a and 43b from a pulse power supply Vp after start-up.

A positive voltage is applied to the power terminal V1 of the inverting boost circuit 43 in FIG. 2 when the battery is reversely connected, and the inverting boost circuit 43 corresponds to a ground side of the IC 4. Power is supplied to the power terminal V2 in FIG. 2 via the diode 46 in FIG. 1. A terminal V3 in FIG. 2 is provided as an output terminal in FIG. 1. The power is suppliable to the power supply circuit 41 via the diode 45 and via the terminals C2 and C1.

An output portion where drains of the MOSFETs 43a and 43b are commonly connected is connected to the power terminal V2 via a capacitor 47 and a diode 43c in the forward direction. The common connection point of the capacitor 47 and the diode 43c is connected to the output terminal V3 via a diode 43d in a reverse direction. The capacitor 13, which is an externally-connnected one, is connected between the output terminal V3 and the power terminal V2. The capacitor 13 is used as an output capacitor.

Figure 3:
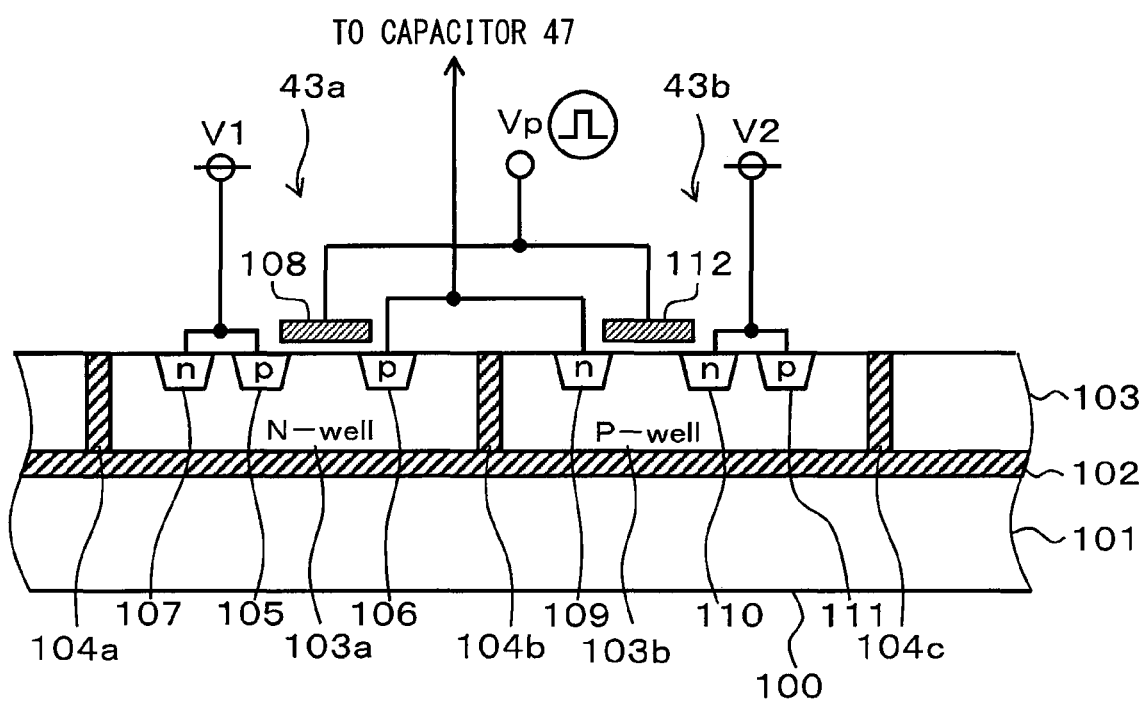
FIG. 3 is a schematic cross-sectional view illustrating a stricture of an IC in part.

FIG. 3 schematically illustrating a cross-section of a portion, the two MOSFETs 43a, 43b, of the inverting boost circuit 43 formed in the IC 4. An SOI substrate is used as a semiconductor substrate 100 with which the IC 4 is formed. In the semiconductor substrate 100, a semiconductor layer 103 formed of a single-crystal silicon is provided above a support substrate 101 via an insulating film 102 such as a silicon oxide film. In the semiconductor layer 103, semiconductor layers 103a, 103b sectioned on a semiconductor element formation region basis are formed. The semiconductor layers 103a, 103b are formed so that they are insulated from each other by insulating films 104a to 104c that surround the semiconductor layers 103a, 103b and that reach the insulating film 102 from a surface of the semiconductor layers 103a, 103b.

The semiconductor layer 103a is provided as an N-well, in which n-type impurity is introduced. The semiconductor layer 103b is provided as a P-well, in which p-type impurity is introduced. In surface parts of the semiconductor layer 103a, two p-type regions 105, 106 and one n-type region 107 are formed. Likewise, in surface parts of the semiconductor layer 103b, two n-type regions 109, 110 and one p-type region 111 are formed.

On an upper surface of each of the semiconductor layers 103a, 103b, an insulating film such as a silicon oxide film (not shown) is formed. On an upper surface of the insulating film between the p-type regions 105 and 106, a gate electrode 108 is provided. On an upper surface of the insulating film between the n-type regions 109 and 110, a gate electrode 112 is provided. The p-type region 105 and the n-type region 107 are commonly connected to the power terminal V1. The n-type region 110 and the p-type region 111 are commonly connected to the power terminal V2. The p-type region 106 and the n-type region 109 are commonly connected to one terminal of the capacitor 47. The gate electrodes 108 and 112 are commonly connected to the pulse power supply Vp.

Next, an operation of the above configuration will be described with reference to FIG. 4 to FIG. 7. In the following description, respective operational cases will be separately described, which are (1) a case of battery normal-connection, (2) a case of battery reverse-connection, and (3) operations at start-up after that.

(1) Case of Battery Normal-Connection

First, explanation will be briefly given on a state where the battery 2 is normally connected to the power conversion device 1, that is, when the positive terminal and the negative terminal of the battery 2 are respectively connected to the first power-input-terminal A1 and the power-input-terminal A2. In this case, the power is supplied to the IC 4 from the first power-input-terminal A1 via the diode 11 and the terminal C1. The power supply circuit 41 generates a certain voltage and supplies the power to the microcomputer 20 via the terminal C7. Consequently, the microcomputer 20 obtains operating power and starts operations. The IC 4 generates gate signals for the six MOSFETs 51 to 56 of the three-phase inverter circuit 5 to drive and control the MOSFETs 51 to 56, causing supply of three-phase AC power to the motor 3 via the terminals B1 to B3.

Figure 4:
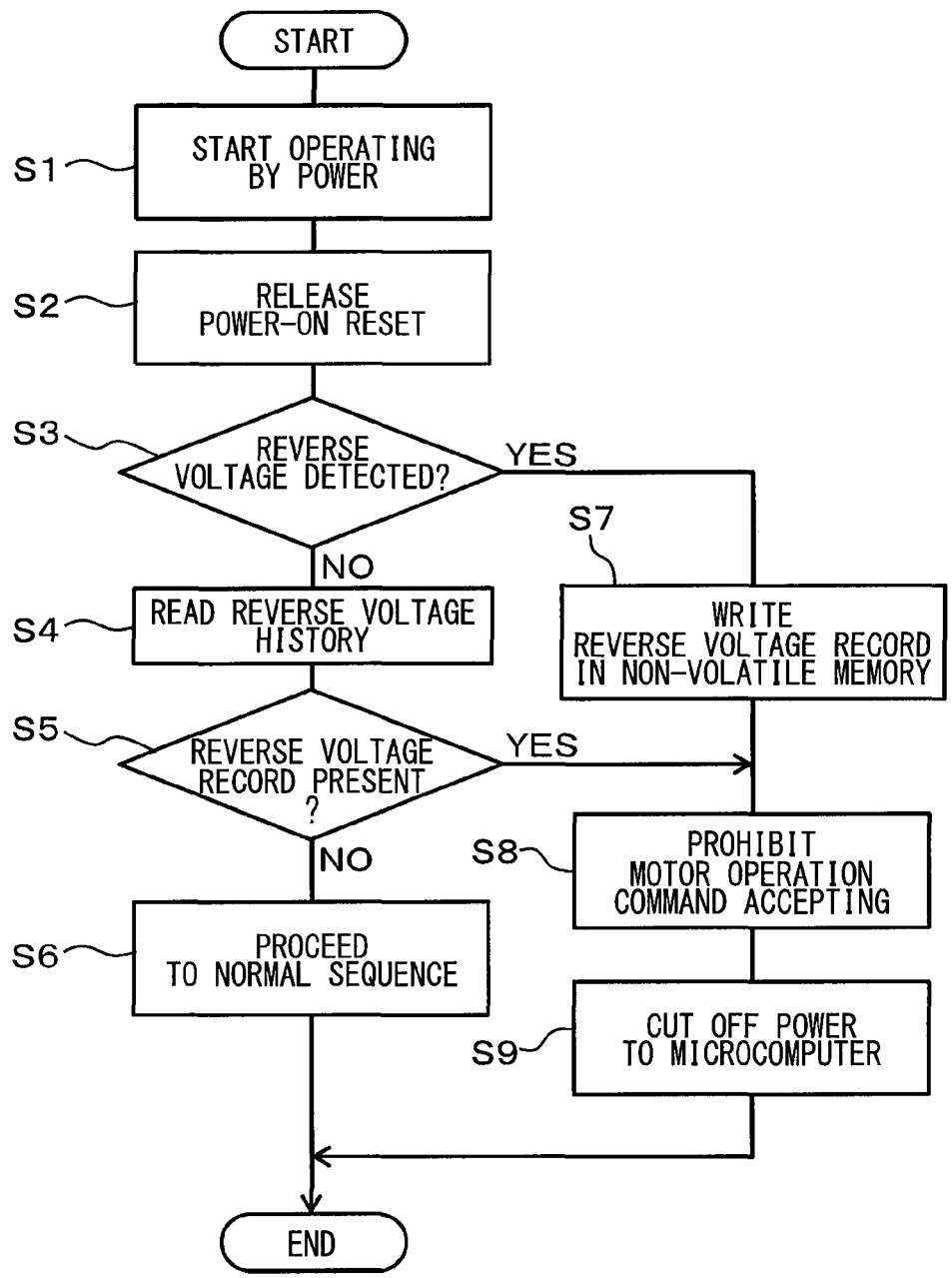
FIG. 4 is a diagram illustrating a flow of processes of a microcomputer.

FIG. 4 illustrates a flow of operations of the microcomputer 20. Upon the IC 4 starting supplying the power, the microcomputer 20 starts up in step S1. Upon starting operation, the microcomputer 20 performs a power-on reset operation. Upon the power becoming stable after elapse of a predetermined time period, the microcomputer 20 releases the power-on reset in step S2.

The microcomputer 20 starts up a program and determines in step S3 whether the reverse voltage is being detected. In this connection, when the battery 2 is normally connected, the supply of power from the terminal C2 is blocked by the diode 46, and therefore, the voltage is not applied to the reverse voltage detection circuit 44. In this case, the determination by microcomputer 20 in step S3 results in NO and the flow proceeds to step S5.

In S4, the microcomputer 20 accesses the non-volatile memory 21 to read out reverse voltage history information. Here, the microcomputer 20 determines whether or not there is a record indicating the reverse voltage was written on or before the previous operation. In the next step of S5, the microcomputer 20 determines whether or not there is the reverse voltage record. When there is no, the microcomputer 20 makes NO determination and proceeds to step S6. In this case, because it is confirmed that the reverse connection of the battery 2 has not occurred, the microcomputer 20 starts usual operations. Specifically, the microcomputer 20 performs a normal operation.

Figure 7:
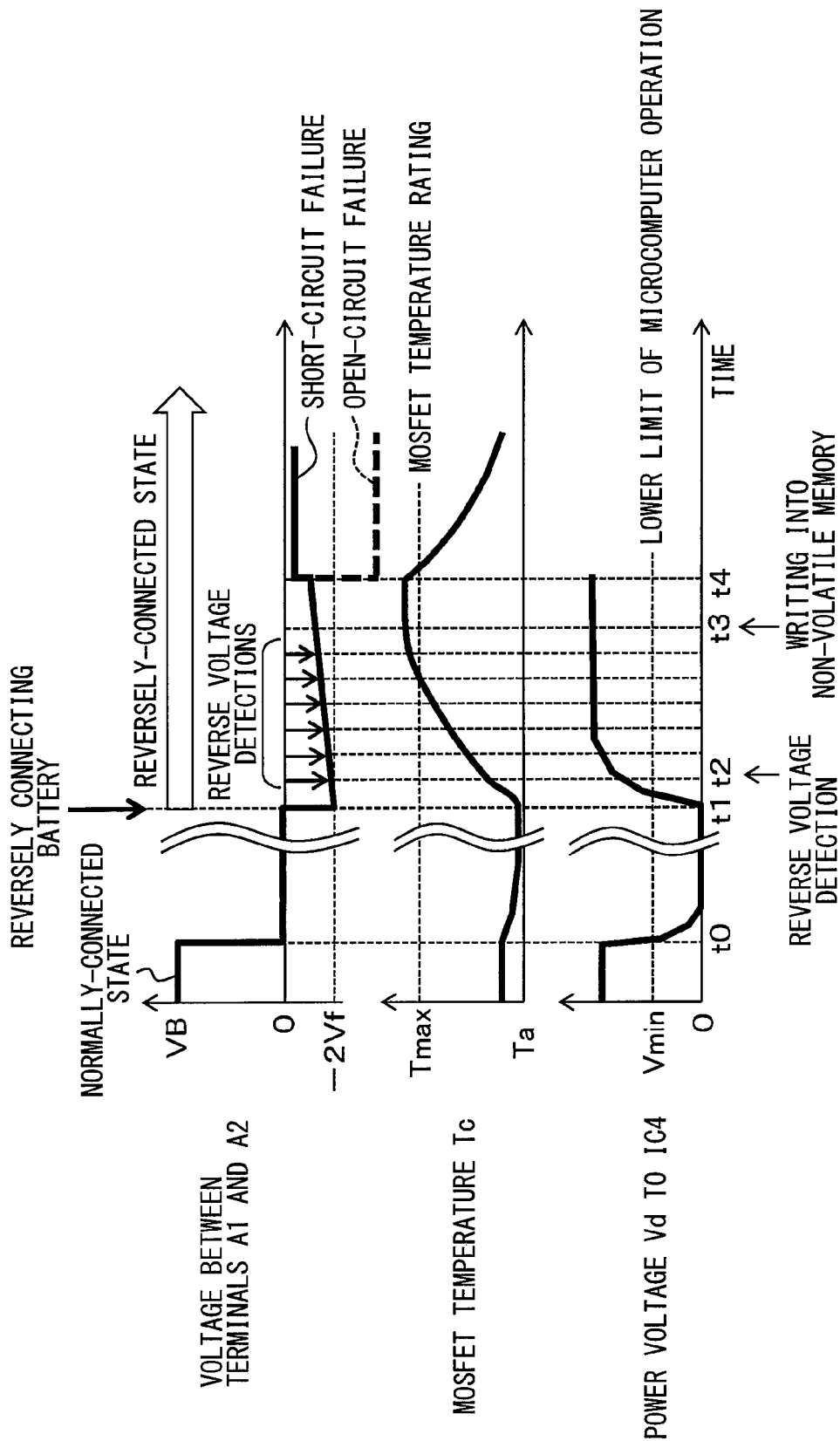
FIG. 7 is a time chart illustrating states of parts of a power conversion device.

The above-mentioned operation corresponds to the operation before a time t0 in FIG. 7, in which the DC voltage VB of the battery 2 is applied between the first and second power-input-terminals A1 and A2 of the power conversion device 1. Further, in this state, as illustrated in FIG. 7, a predetermined voltage is supplied to the IC 4. Additionally, the three-phase inverter circuit 5 is driven and the MOSFETs 51 to 56 are in an on-off controlled state and MOSFET temperature Tc is in a predetermined temperature range.

(2) A Case of Battery Reverse-Connection

Explanation will be given on a case where the battery 2 is reversely connected to the power conversion device 1, that is, the positive terminal and the negative terminal of the battery 2 are respectively connected to the second power-input-terminal A2 and the first power-input-terminal A1. In this case, the power is not supplied to the IC 4 from the first power-input-terminal A1 via the diode 11.

A reverse voltage is applied to the three-phase inverter circuit 5, so that currents flow via the diodes $51a$ to $56a$ of the respective six MOSFETs 51 to 56. In this case, two diodes in each arm are in a series-connected state in the forward direction, and thus, a voltage that is two times as large as a forward direction voltage Vf is applied between the first and second power-input-terminals A1 and A2 in the reverse direction.

Because the positive electrode and the negative electrode of battery 2, respectively, are connected to the second power-input-terminal A2 and the first power-input-terminal A1, the current flows in the reverse voltage detection circuit 44 and its detection voltage is input to the microcomputer 20.

In this case, the IC 4 is put in a state where the reverse voltage 2Vf is applied from the second power-input-terminal A2 via the inverting boost circuit 43 and the diode 46. The reverse voltage 2Vf is applied to the inverting boost circuit 43 as a positive voltage between the power terminals V1 and V2, and the boost operation is performed.

Figure 5:
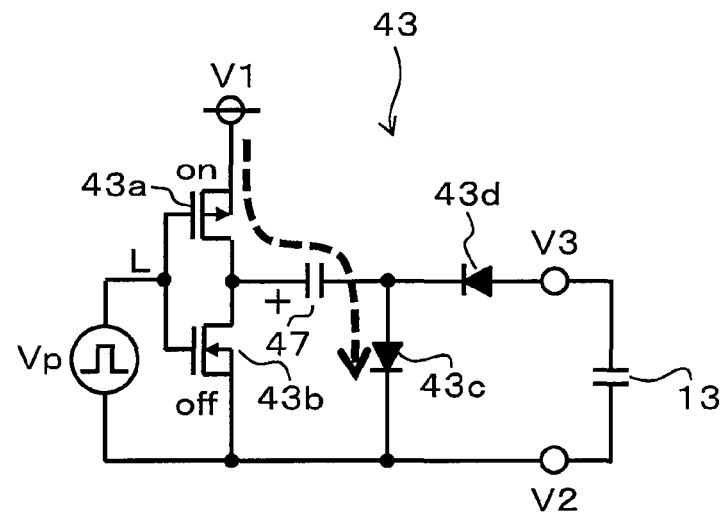
FIG. 5 is a diagram illustrating an operation of an inverting boost circuit.
Figure 6:
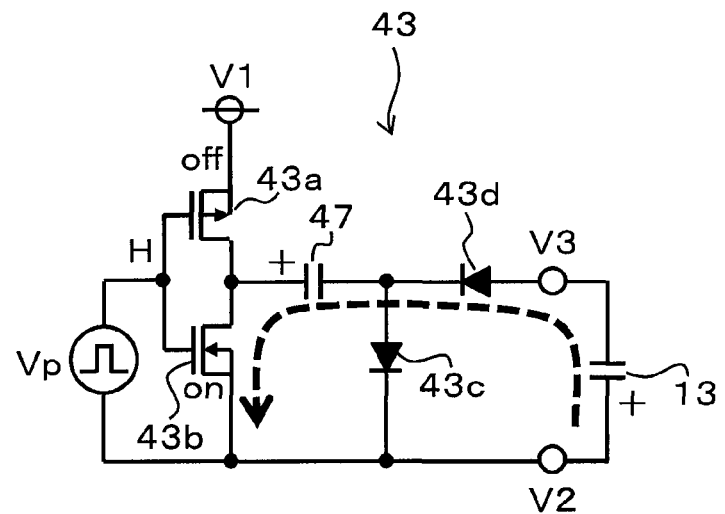
FIG. 6 is a diagram illustrating an operation of the inverting boost circuit.

FIG. 5 and FIG. 6 are diagrams for explanation on the boost operation of the inverting boost circuit 43. By the input voltage to the power terminal V1, the pulse power supply Vp operates and provides driving pulses to the gates of the MOSFETs $43a$ and $43b$. First, as illustrated in FIG. 5, when the pulse of the pulse power supply Vp becomes low level L, the MOSFET $43a$ is turned on and the MOSFET $43b$ is turned off. Accordingly, as illustrated by a broken line arrow in FIG. 5, the capacitor 47 is charged by electric conduction from the power terminal V1 through the diode $43c$. Among the terminals of the capacitor 47, the terminal connected to the MOSFET $43a$ has a positive voltage.

As illustrated in FIG. 6, when the pulse of the pulse power supply Vp becomes high level H, the MOSFET $43a$ is turned off and the MOSFET $43b$ is turned on. Accordingly, the drain of the MOSFET $43b$ is lowered to a ground level. Because of this, among the terminals of the capacitor 47, the terminal connected to the diode $43d$ has a negative electric potential and the capacitor 13 is charged to have a reverse voltage, as illustrated by a broken line arrow in FIG. 6.

Then, the level of the pulse of the pulse power supply Vp is alternately changed, and thereby the above-mentioned operations of FIG. 5 and FIG. 6 are repeatedly performed. Finally, the negative voltage stepped-up at the capacitor 13 is generated as the output voltage. Specifically, a voltage inverted and stepped-up is generated on the ground side, and it is output from the terminal C2 via the diode 45 and input to the IC 4 via the terminal C1 again, and the power is supplied to the power supply circuit 41 as the positive voltage.

In the above-mentioned boost operation in the inverting boost circuit 43, because the IC 4 used is the integrated circuit using the SOI substrate, it is possible to suppress an occurrence of latch in the internal circuit at the time of reverse connection or the like and it is possible to realize accurate operation.

When the supply of power to the microcomputer 20 starts in the above way in S1, the microcomputer 20 starts operations after releasing the power-on reset in S2, as shown in FIG. 4. Because the reverse voltage from the reverse voltage detection circuit 44 is input to the microcomputer 20, the microcomputer 20 makes YES determination in S3 and proceeds to S7.

In S7, the microcomputer 20 records various necessary data in the non-volatile memory 21 as the history information, including a value of the input reverse voltage, a date and time and the like, wherein date and time setting was made in advance. In this context, the microcomputer 20 may perform sampling of the detection of reverse voltage a plurality of times at predetermined time intervals or appropriate timings to successively record it in the non-volatile memory 21. At the same time, the reverse current detected by the current detection circuit 42 may be further recorded in the non-volatile memory 21.

Then, in S8, the microcomputer 20 prohibits the IC 4 from accepting a motor operation command, and further, in S9, the microcomputer 20 outputs a command to halt the power supply circuit 41 in order to cutoff the power to the microcomputer 20.

Due to the reverse connection of the battery 2, a high current flows in the diodes 51a to 56a connected in parallel to the respective MOSFETs 51 to 56 in the three-phase inverter circuit 5, and consequently, diode breakdown may occur. Nevertheless, until the breakdown of diode 51a to 56a, the microcomputer 20 is capable of recording, in the non-volatile memory 21, status of the reverse voltage and the reverse current. This is usable afterward as important information to analyze in what circumstances the breakdown occurred.

With reference to FIG. 7, description will be given as to signal changes in the parts in connection with the above operation. When the normally connected battery 2 as described is detached at the time t0, the voltage between the first and second power-input-terminals A1 and A2 of the power conversion device 1 becomes zero, as shown in FIG. 7. Likewise, the voltage Vd supplied to the IC 4 also starts going down at the time t0 and then becomes zero via a minimum operating voltage Vmin of the microcomputer 20. Also, as shown in FIG. 7, the temperature Tc of the MOSFETs 51 to 56 of the three-phase inverter circuit 5, which have been energized and controlled, is also gradually going down to near a surrounding temperature Ta.

After that, when the battery 2 is reversely connected at a time t1, the DC voltage VB of the battery 2 is applied as a negative voltage between the first and the second power-input-terminals A1 and A2, and in this case, a current flows through the series-connected two diodes in a series circuit of a high side and a low side constituting each arm of the MOSFETs 51 to 56 of the three-phase inverter circuit 5. As a result, the diode forward voltage 2Vf due to the two diodes is applied as a negative voltage between the first and the second power-input-terminals A1 and A2, as illustrated in the FIG. 7.

Accordingly, because of the high current flowing in the diodes 51a to 56a, the temperature Tc of the MOSFETs 51 to 56 formed in a single body rises, as shown in FIG. 7. In addition, because of the application of the reverse voltage, the inverting boost circuit 43 operates and performs the boost operation as described above, and thus, the power voltage Vc supplied to the IC 4 gradually increases and exceeds the minimum operating voltage Vmin of the microcomputer 20 as shown in FIG. 7, and accordingly, the microcomputer 20 becomes operable.

As a result, the microcomputer 20 performs sampling to retain the reverse voltage detected by the reverse voltage detection circuit 44 and the reverse current detected by the current detection circuit 42 at the appropriate timings, and stores the reverse voltages and the reverse currents in the non-volatile memory 21 at a time t3.

When the temperature Tc of the MOSFETs 51 to 56 increases due to the high current flowing in the diodes 51a to 56a and exceeds a MOSFET temperature rating Tmax, the breakdown such as short-circuit failure or open-circuit failure may occur at a time t4 as shown in FIG. 7. As a result, the microcomputer 20 loses its operating power and stops operating. Nevertheless, before stopping operating, the microcomputer 20 has written into the non-volatile memory 21 the history information on the reverse voltage and the reverse current, and therefore, it becomes possible to perform accurate failure analysis based on the history information.

(3) Operations at Start-Up After That

Note that, when values of the reverse voltage and the reverse current are once stored in the non-volatile memory 21 as described above, this information is maintained as the reverse voltage history unless the stored data in the non-volatile memory 21 is erased in repairing or the like. Therefore, the reverse voltage history and reverse current history are retained in the non-volatile memory 21 when the reversely-connected battery 2 is taken off prior to the occurrence of breakdown.

Accordingly, for example, when the battery 2 is normally connected next time, even if the microcomputer 20 starts operating through S1, S2 in FIG. 4 and does not detect the reverse voltage in S3, the microcomputer 20 reads out the reverse voltage history in S4. As a result, the microcomputer 20 makes YES determination in S5 and proceeds to S8 to prohibit the acceptance of the motor operation command, without starting the controlling and driving of the three-phase inverter circuit 5.

In the above first embodiment, the non-volatile memory 21, the inverting boost circuit 43 and the reverse voltage detection circuit 44 are arranged so that when the battery 2 is reversely connected, the microcomputer 20 starts up by the power generated by the inverting boost circuit 43 and records the reverse voltage and the reverse current in the non-volatile memory 21. Therefore, in form of history information, information on values of the reverse voltage and the current value are retainable in the non-volatile memory 21 as status of the failure caused by the reverse connection of the battery 2. Accordingly, in failure analysis, it becomes possible to accurately perform cause estimation.

In the above-mentioned embodiment, the reverse voltage detected by the reverse detection circuit 44 and the reverse current detected by the current detection circuit 42 may be detected by the microcomputer 20 only once at a predetermined timing or a plurality of times at predetermined timings, for recording it in the non-volatile memory 21, and therefore, it becomes possible to perform the cause estimation based on more detailed reverse voltage history information.

In the first embodiment, because the IC 4 is formed as a semiconductor integrated circuit using an SOI substrate, it is possible to, at reverse connection of the battery 2 or the like, suppress an occurrence of latch state in the internal circuit of the inverting boost circuit 43 formed as a single body. Accordingly, it is possible to perform accurate and secure operation.

In the above-mentioned embodiment, although the reverse current is stored in the non-volatile memory 21 in addition to the reverse voltage, only the reverse voltage may be stored. Furthermore, although the reverse voltage detected by the reverse voltage detection circuit 44 is detected at appropriate timings to store results of multiple detections in the non-volatile memory 21, it may not necessary to store reverse voltage values of multiple detections. Additionally, the multiple detections may be performed at given time intervals but not necessarily at constant time intervals.

Second Embodiment

Figure 8:
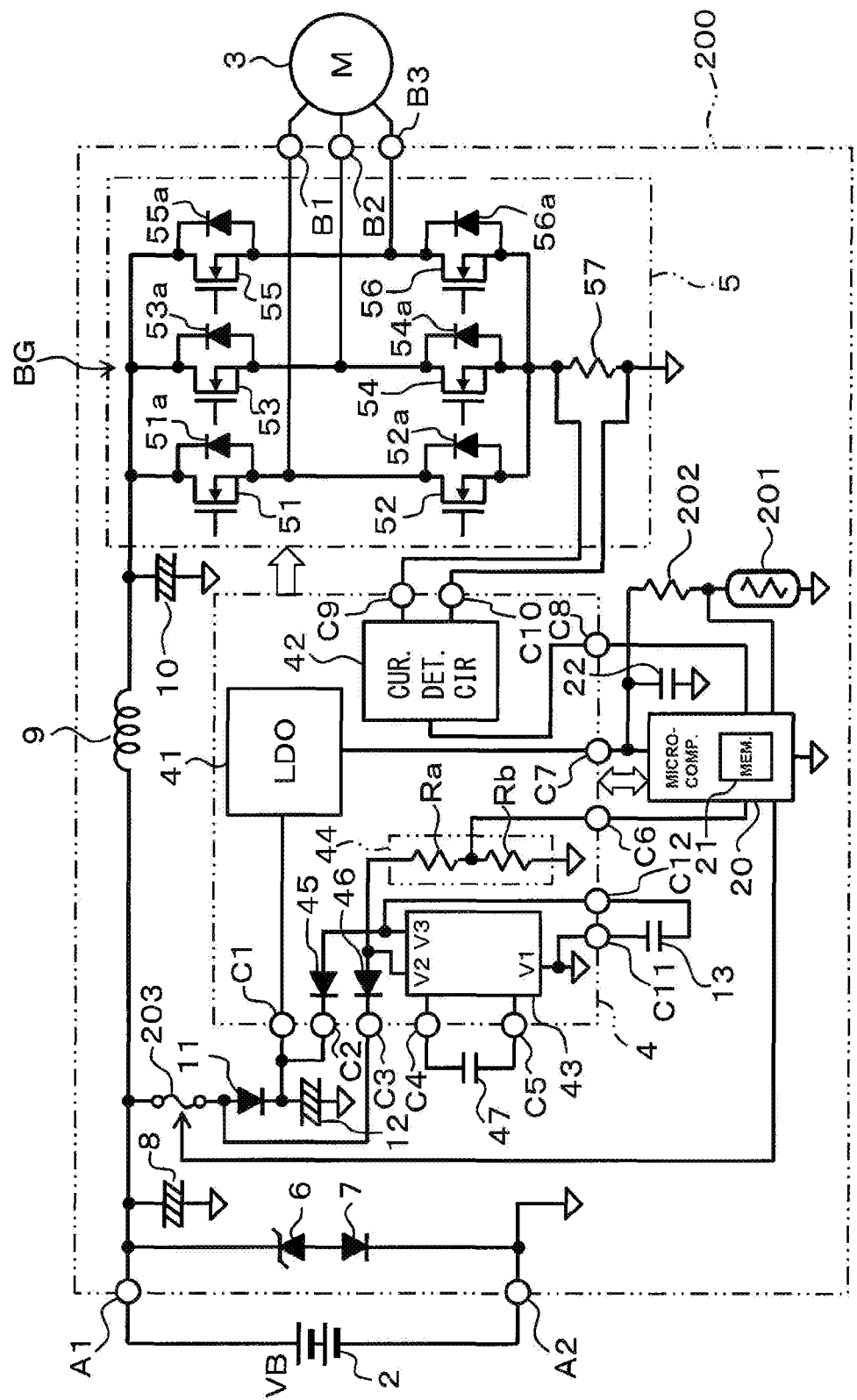
FIG. 8 is a diagram illustrating an electrical configuration of a power conversion device according to a second embodiment.
Figure 9:
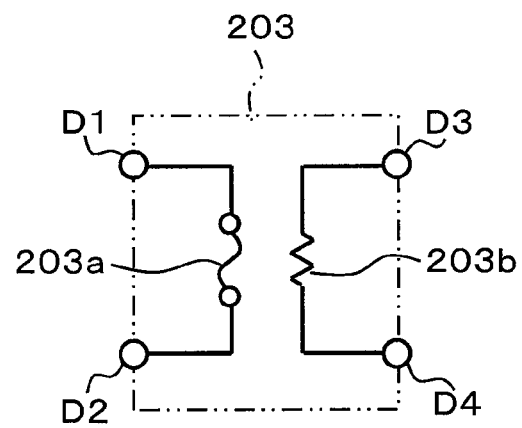
FIG. 9 is a diagram illustrating an electrical configuration of a fuse.
Figure 10:
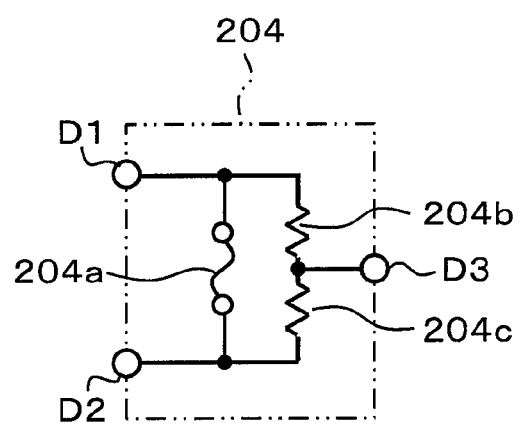
FIG. 10 is a diagram illustrating an electrical configuration of another fuse.

FIG. 8 to FIG. 10 illustrate a second embodiment. In the below, differences from the first embodiment will be described. In the present embodiment, a power conversion device 200 includes a temperature detection element 201 for detecting substrate temperature and a fuse 203 having a built-in heating element.

As illustrated in FIG. 8, in addition to the configuration of the first embodiment, the temperature detection element 201 is arranged to detect substrate temperature of the power conversion device 200. The temperature detection element 201 is, for example, a temperature sensing element such as a thermistor, and forms a series circuit together with a resistor 202. A detection voltage of the temperature detection element 201 is input in the microcomputer 20. The microcomputer 20 performs an A-to-D conversion to a signal of the detection voltage input from the temperature detection element 201 and calculates the substrate temperature.

The fuse 203 is provided between the first power-input-terminal A1 and the diode 11. When the fuse 203 receives a fusing signal from the microcomputer 20, the fuse 203 is self-heated due to energization to the heating element and is fused. FIG. 9 illustrates the fuse 203 of four-terminals type having a built-in heating element. A fuse 203a is connected between terminals D1 and D2. A heating element 203b is connected between terminals D3 and D4.

When a signal for turning on a switching element provided on a conduction path to the heating element 203b is applied from the microcomputer 20, the self-heating occurs due to energization from the power supply. Heat generation of the heating element 203b causes the fuse 203a to be fused, which leads to cutoff of the conduction path and cutoff of the energization.

In the above-mentioned configuration, when the battery 2 is connected in the reverse polarity to the first and second power-input-terminals A1 and A2 of the power conversion device 200, the temperature detection element 201 and the fuse 203 operate in the below way. When the boost operation is performed by the inverting boost circuit 43 due to the reverse connection of the battery 2 and the microcomputer 20 starts operating, the reverse voltage and the reverse current are detected and recorded in the non-volatile memory 21 in a manner similar to the first embodiment.

In this context, the microcomputer 20 applies a detection-usage voltage to the series circuit of the temperature detection element 201 and the resistor 202, receives a detection signal from the temperature detection element 201 at this time, and calculates the substrate temperature. The microcomputer 20 records, in the non-volatile memory 21, information on the calculated substrate temperature together with the information on the reverse voltage and the reverse current. Accordingly, information on circumstances until the destruction of three-phase inverter circuit 5 at the reverse connection of the battery 2 is enriched, and more detailed circumstances associated with an occurrence of failure is left.

When the reverse connection of the battery 2 occurs, the microcomputer 20 outputs to the fuse 203 a signal for starting the heating operation. Accordingly, the heating element 203b provided in the fuse 203 is energized to generate heat and the fuse 203a is fused. As a result, the conduction path to the microcomputer 20 is placed in a cut-off state. Furthermore, even when the battery 2 is carelessly connected prior to the recovery of the failure, the IC 4 is not powered.

In the second embodiment, because the temperature detection element 201 and the fuse 203 are arranged, conditions such as a temperature increase at the reverse connection of the battery are storable as temperature information, and thus, more detailed information are storable in the non-volatile memory 21.

Furthermore, because the fuse 203 is fused by the microcomputer 20 at the reverse connection of the battery 2, it becomes possible to surely stop operations.

A fuse 204 illustrated in FIG. 10 may be employed in place of the fuse 203 in the above-mentioned configuration. The fuse 204 also includes a heating element, and is fused by self-heating. One illustrated in FIG. 10 is of a three terminal type and includes terminals D1 to D3. A fuse 204a and a series circuit of heating elements 204a, 204b are connected between the terminals D1 and D2. A common connection point of the heating elements 204a and 204b is connected to the terminal D3. In this configuration, electric current is provided to the terminal D3 based on a fuse command signal from the microcomputer 20.

The temperature detection element 201 may be arranged to detect temperature near the three-phase inverter circuit 5 or temperature of the six MOSFETs 51 to 56.

Third Embodiment

Figure 11:
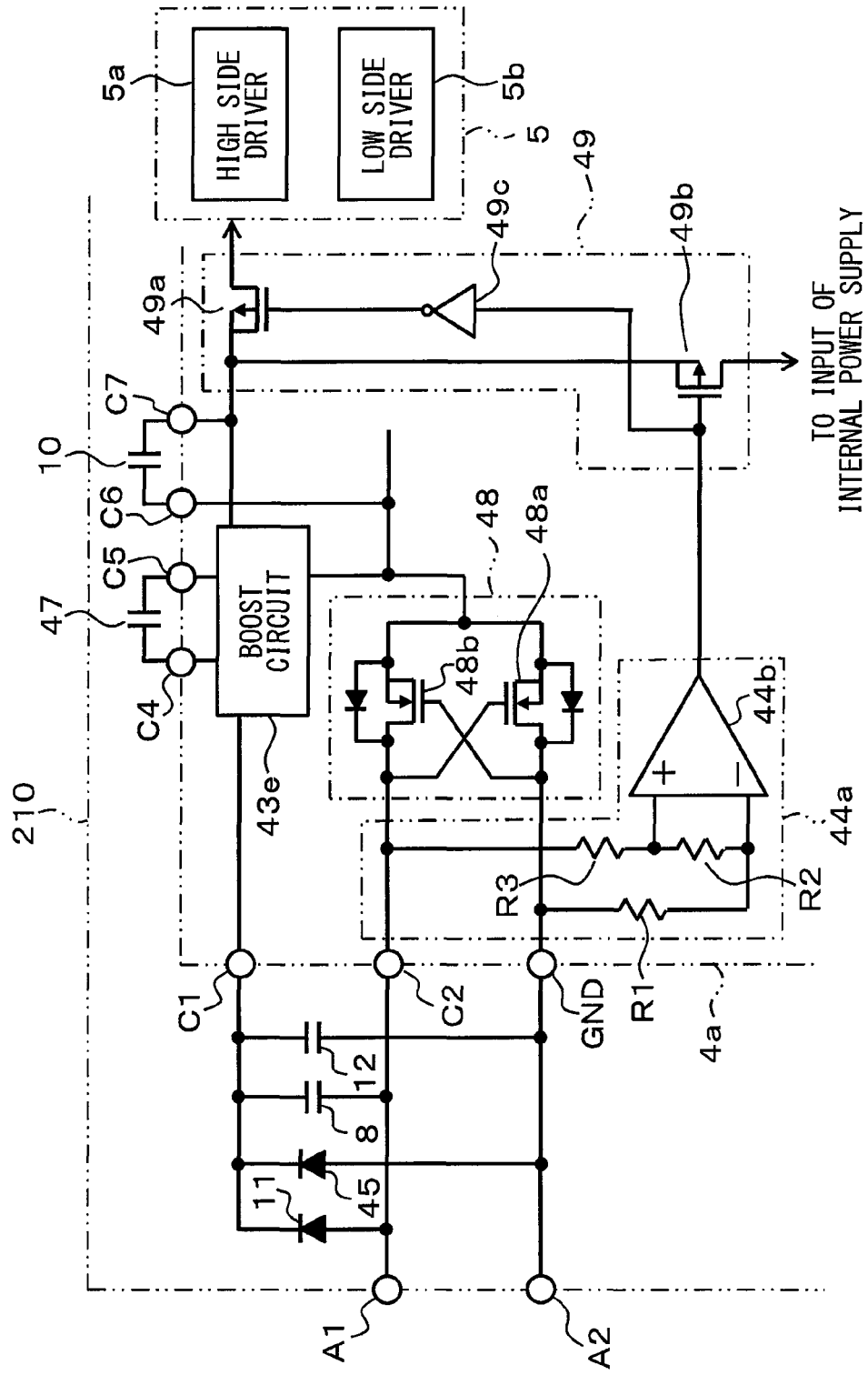
FIG. 11 is a diagram illustrating an electrical configuration of a power conversion device according to a third embodiment.
Figure 12:
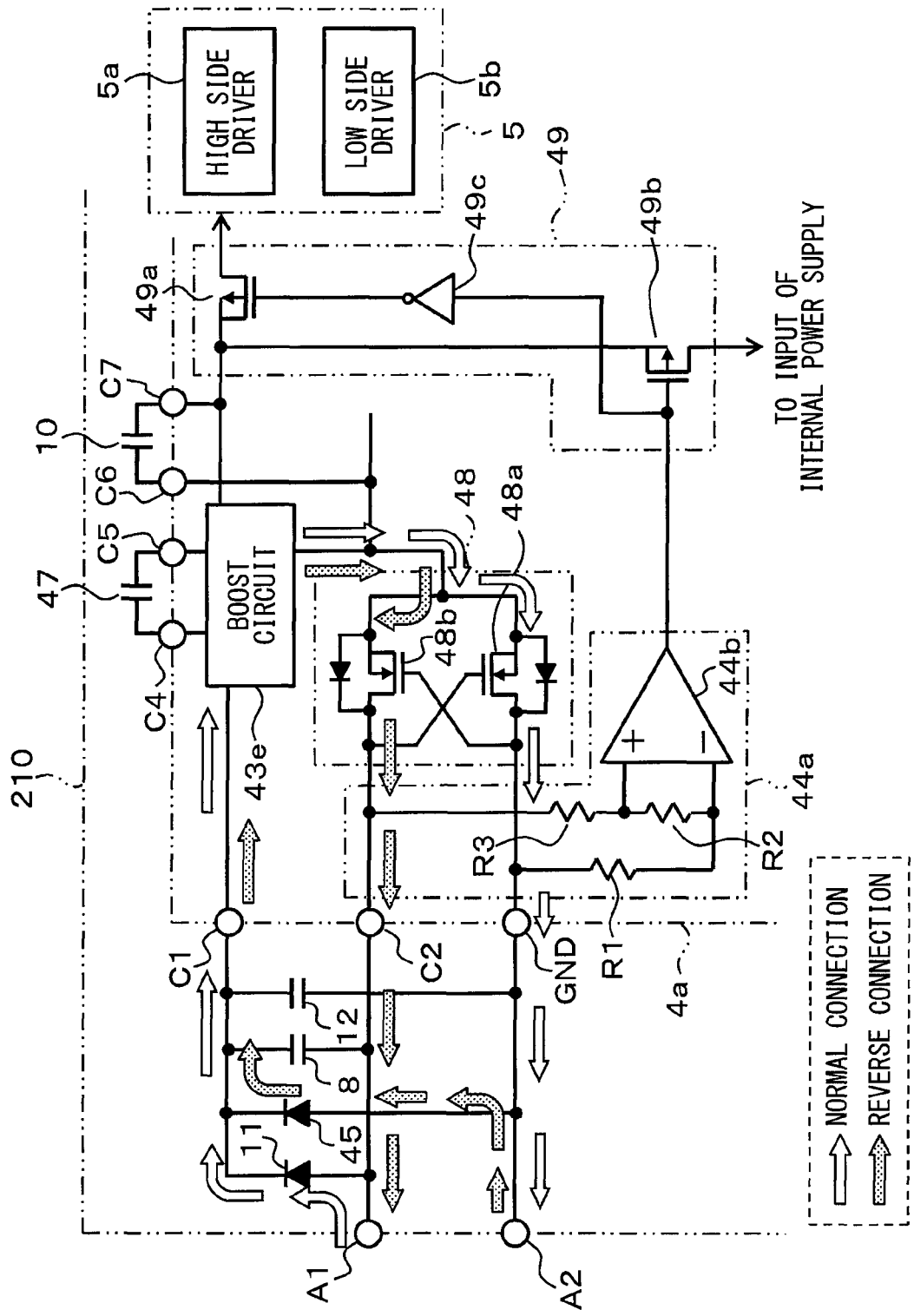
FIG. 12 is a diagram illustrating a power supply path.

FIG. 11 and FIG. 12 illustrate a third embodiment. In the below, differences from the first embodiment will be described. In the present embodiment, an IC 4a is arranged as a driving circuit in place of the IC 4, and a boost circuit 43e is configured to play both roles of: a boost circuit that supplies power to a high side driving unit 5a provided in the three-phase inverter circuit 5; and the inverting boost circuit 43 of the first embodiment. Power is supplied to a low side driving unit 5b in the three-phase inverter circuit 5 from a power supply (not shown).

FIG. 11 illustrates a part that switches a power supply path to the boost circuit 43e in the power conversion device 210. In FIG. 11, the boost circuit 43e has an internal configuration similar to that of the inverting boost circuit 43 of the first embodiment. The boost circuit 43e has an input side terminal which is connected to the terminal C1 of the IC 4a and a ground side terminal which is connected to a switching circuit 48. A capacitor 47 for output is connected to the boost circuit 43a so that the capacitor 47 is external to the boost circuit 43a. A capacitor 10 for output is connected between a ground side terminal and an output terminal Vout of the boost circuit 43a.

A reverse voltage detection circuit 44a includes three resistors R1 to R3 and a comparator 44b. An inverting input terminal of the comparator 44b is connected to a ground terminal GND via the resistor R1, and connected to a non-inverting input terminal via a resistor R2. Furthermore, an non-inverting input terminal of the comparator 44b is connected to the terminal C2 of the IC 4a via the resistor R3.

An input switching circuit 48 includes a MOSFET 48a and a MOSFET 48b of n-channel type. The MOSFET 48a includes a drain connected to the terminal C2 of the IC 4a and a source connected to the ground terminal of the boost circuit 43e. The MOSFET 48b includes a drain connected to the ground terminal GND of the IC 4a and a source connected to the ground terminal of the boost circuit 43e. The gate of the MOSFET 48a is connected to the ground terminal GND of the IC 4a, and the gate of the MOSFET 48b is connected to the terminal C2 of the IC 4a.

An output switching circuit 49 includes a MOSFET 49a and a MOSFET 49b of p-channel type, and an inverter circuit 49c. The MOSFET 49a is connected between the output terminal Vout of the boost circuit 43e and the high side driving unit 5a of the three-phase inverter circuit 5. The gate of the MOSFET 49a is connected to the output terminal of the comparator 44b via the inverter 49c. The MOSFET 49b is connected to the output terminal Vout of the boost circuit 43e and an input of an internal power supply. The gate of the MOSFET 49b is connected to the output terminal of the comparator 44b.

Next, operations of the third embodiment will be described also with reference to FIG. 12.

FIG. 12 illustrates: a conduction path in the case where the battery 2 is normally connected between the first and second power-input-terminals A1 and A2, that is, a conduction path at the normal time; and a conduction path in the case where the battery 2 is reversely connected, that is, a conduction path at the reverse connection time.

First, the case where the battery 2 is normally connected will be described. In this case, in the input switching circuit 48, the MOSFET 48a is in an on state and the MOSFET 48b is in an off state because of an electric potential difference relation. Accordingly, the DC voltage VB of the battery 2 is supplied to the terminal C1 of the IC 4a from the first power-input-terminal A1 via the diode 11, and due to the MOSFET 48a turning on, the ground terminal GND of the IC 4a is connected to the negative terminal of the battery 2 connected to the second power-input-terminal A2.

In the reverse voltage detection circuit 44a, a positive detection voltage of a voltage divider circuit formed by the resistors R1 to R3 is input to the non-inverting input terminal of the comparator 44b and a signal of high level is output. Because of this, in the output switching circuit 49, a signal of low level is applied to the gate of the MOSFET 49a via the inverter circuit 49c and the MOSFET 49a is turned on, and a signal of high level is applied to the MOSFET 49b and the MOSFET 49b is maintained at an off state due to receiving a signal of high level.

Accordingly, as illustrated by outlined arrows in FIG. 12, a power supply path is formed from the first power-input-terminal A1 to the second power-input-terminal A2 via the diode 11, the terminal C1, the boost circuit 43e, the ground terminal of the boost circuit 43e, the MOSFET 48b, and the ground terminal GND. The boost circuit 43e performs a boost operation to supply a boosted voltage from its output terminal to the high side driving unit 5a of the three-phase inverter circuit 5 via the MOSFET 49a.

Now, explanation will be given on a case where the battery 2 is reversely connected to the first and second power-input-terminals A1 and A2. In this case, in the input switching circuit 48, the MOSFET 48a is in an on-state and the MOSFET 48b is in an off-state because of an electric potential difference relation. Because of this, a voltage is applied to the terminal C1 of the IC 4a from the second power-input-terminal A2 via the diode 45. The first power-input-terminal A1 is in conductive to the ground terminal of the boost circuit 43e from the terminal C2 of the IC 4a via the MOSFETs 48a that is in on state.

As described above, in the reverse connection state of the battery 2, a voltage of about −2Vf is applied between the first and the second power-input-terminals A1-A2. In this state, in the reverse voltage detection circuit 44a, a voltage is applied from the second power-input-terminal A2 having a positive electric potential to the first power-input-terminal A1 having a negative electric potential, so that a voltage drop occurs via the resistors R1, R2, R3. Accordingly, the comparator 44b outputs a low-level signal.

As a result, in the output switching circuit 49, a high-level signal is applied to the gate of the MOSFET 49a via the inverter circuit 49c and the MOSFET 49a is put in an off-state. Further, a low-level signal is applied to the gate of the MOSFET 49b and the MOSFET 49b is put in an on-state.

Because of the above, as illustrated by oblique-lines-hatched arrows in FIG. 12, a voltage of the forward direction voltage 2Vf corresponding to two diodes is applied to the boost circuit 43e via the terminal C1 from the second power-input-terminal A2 and a power supply path from the ground terminal of the boost circuit 43e to the first power-input-terminal A1 via the MOSFET 48a and the terminal C2 is formed.

The boost circuit 43a performs a boost operation to supply power to the internal power supply from its output terminal via the MOSFET 49b. As a result, the microcomputer 20 is powered and starts up and performs the above-mentioned operation.

In the third embodiment, because the boost circuit 43e for supplying power to the high side driving unit 5a of the three-phase inverter circuit 5 is configured to further serve as the inverting boost circuit, it is not required to additionally include an inverting boost circuit. Further adding the reverse voltage detection circuit 44a, the input switching circuit 48, and the output switching circuit 49 to a conventional configuration may enable construction of the present embodiment.

Other Embodiments

The above embodiments can be modified or extended in, for example, the below ways.

The non-volatile memory 21 serving as a non-volatile storage device may be built in the microcomputer 20 or alternatively may be a device separately provided from the microcomputer 20.

The bridge circuit may be applicable to a two-phase or single-phase bridge circuit, and the like in addition to the three-phase inverter circuit 5, In the second embodiment, both the temperature detection element 201 and the fuse 203 are additionally provided. Alternatively, only one of them may be provided.

Although the present disclosure has been described in accordance with embodiments, it is to be understood that the present disclosure is not limited to the embodiments and structure thereof. The present disclosure convers various modification examples and modifications within an equivalent scope. Additionally, various combinations and forms, and other combinations and forms including only a single element, or more elements or less, also fall within the spirit and scope of the present disclosure.

The invention claimed is:

1. A power conversion device comprising:
   a bridge circuit that is connected between first and second power-input-terminals;

a driving circuit that is supplied with power from a DC power source via the first and second power-input-terminals, and that drives and controls the bridge circuit;

a control circuit that is capable of writing data into a non-volatile storage device; and a boost circuit that starts up and performs a boost operation to supply power to the control circuit when the DC power source is connected in reverse polarity to the first and second power-input-terminals; and a reverse voltage detection circuit that detects a reverse voltage generated when the DC power source is connected in the reverse polarity to the first and second power-input-terminals, wherein the boost circuit supplies the power to the control circuit when the DC power source is connected in reverse polarity to the first and second power-input-terminals, by performing the boost operation based on a voltage that is generated in the bridge circuit at a time when the DC power source is connected in the reverse polarity to the first and second power-input-terminals, and when the boost circuit starts up, the control circuit is supplied with the power and records in the non-volatile storage device a state of the reverse voltage detected by the reverse voltage detection circuit.

2. The power conversion device according to claim 1, wherein:

when starting up, the control circuit reads out information stored in the non-volatile storage device, and when there is a record of the reverse voltage, the control circuit stops the driving circuit from driving and controlling the bridge circuit.

3. The power conversion device according to claim 1, further comprising a current detection circuit that detects positive and negative current flowing in the bridge circuit, wherein the control circuit records in the non-volatile storage device a value of a reverse current detected by the current detection circuit in addition to the reverse voltage detected by the reverse voltage detection circuit.

4. The power conversion device according to claim 1, wherein in the non-volatile storage device, the control circuit records, as a time series, the reverse voltage detected by the reverse voltage detection circuit a plurality of times.

5. The power conversion device according to claim 1, further comprising a fuse having a built-in heating element, the fuse being arranged in a power supply path to the control circuit, wherein the control circuit outputs a command to fuse the fuse after the reverse voltage detection circuit detects the reverse voltage.

6. The power conversion device according to claim 1, wherein:

the boost circuit is configured to further serve as a boost circuit for a high side driver of the bride circuit.

7. The power conversion device according to claim 1, wherein the boost circuit is provided as an integrated circuit formed on a Silicon On Insulator (SOI) substrate.

8. A power conversion device comprising:

a bridge circuit that is connected between first and second power-input-terminals;

a driving circuit that is supplied with power from a DC power source via the first and second power-input-terminals, and that drives and controls the bridge circuit;

a control circuit that is capable of writing data into a non-volatile storage device;

a temperature detection element that detects a temperature of a substrate on which the bridge circuit is disposed;

a boost circuit that starts up and performs a boost operation to supply power to the control circuit when the DC power source is connected in reverse polarity to the first and second power-input-terminals; and a reverse voltage detection circuit that detects a reverse voltage generated when the DC power source is connected in the reverse polarity to the first and second power-input-terminals, wherein when the boost circuit starts up, the control circuit is supplied with the power and records in the non-volatile storage device a state of the reverse voltage detected by the reverse voltage detection circuit, and the control circuit records in the non-volatile storage device temperature information on the substrate detected by the temperature detection element in addition to the reverse voltage detected by the reverse voltage detection circuit.

\* \* \* \* \*